(12) United States Patent
Cao et al.

(10) Patent No.: US 6,265,325 B1
(45) Date of Patent: Jul. 24, 2001

(54) METHOD FOR FABRICATING DUAL GATE DIELECTRIC LAYERS

(75) Inventors: Min Cao, Mountain View; Dietrich W Vook, Menlo Park, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/299,332

(22) Filed: Apr. 26, 1999

(51) Int. Cl.7 .......................... H01L 21/31; H01L 21/469
(52) U.S. Cl. ............................. 438/763; 438/239
(58) Field of Search .................. 438/239, 279, 438/300, 301, 564, 763, 241, 287, 530, 542

(56) References Cited

U.S. PATENT DOCUMENTS

| | | | |
|---|---|---|---|
| 5,422,289 | 6/1995 | Pierce | 437/32 |
| 5,447,874 | 9/1995 | Grivna et al. | 437/40 |
| 5,658,806 | 8/1997 | Lin et al. | 438/157 |
| 5,668,035 | * 9/1997 | Fang et al. | 438/239 |
| 6,090,691 | * 7/2000 | Ang et al. | 438/564 |

* cited by examiner

Primary Examiner—David Nelms
Assistant Examiner—Phuc T. Dang

(57) ABSTRACT

A method for fabricating dual gate dielectric layers on a semiconductor substrate involves utilizing a single photolithographic step to form layer stacks having two different gate dielectric layers and associated polysilicon layers, and then utilizing a physical planarization process to remove excess polysilicon and silicon oxide. According to the method, a first gate dielectric is formed on the first and second device areas of a substrate. A first polysilicon layer is deposited onto the first gate dielectric, and portions of the first polysilicon layer are removed utilizing a photolithographic process. The first gate dielectric is removed over the second device area, and a second, thinner gate dielectric is formed over the second device area. A second polysilicon layer is formed over the second gate dielectric and over the first polysilicon layer. The second polysilicon layer is then removed utilizing chemical mechanical polishing in order to form a common plane between the first polysilicon layer and the second polysilicon layer.

18 Claims, 4 Drawing Sheets

METHOD FOR FABRICATING DUAL GATE DIELECTRIC LAYERS

TECHNICAL FIELD

The invention relates generally to the fabrication of semiconductor devices, and more particularly to the fabrication of two different gate dielectric layers on the same substrate.

BACKGROUND ART

Many integrated circuits that perform multiple functions require transistors having different operating characteristics on the same chip. Specifically, transistors having different gate dielectric (oxide) thicknesses are needed on the same chip to accommodate different voltage requirements.

One prior art technique for fabricating an integrated circuit having two different gate dielectric thicknesses that correspond to two different device areas involves a single photolithographic process. According to the technique, a first gate dielectric is formed on a substrate over two device areas, with the two device areas being electrically separated by field oxide. A photoresist mask is used to protect the gate dielectric over the first device area, while the gate dielectric over the second device area is removed using known etching techniques. The photoresist mask is then removed from the first gate dielectric and a second gate dielectric is formed. In the process of forming the second gate dielectric on the second device area, the thickness of the first gate dielectric is increased by approximately the same thickness as the second gate dielectric. The result of the process is a first gate dielectric having a first thickness and a second gate dielectric having a second thickness. Although the fabrication process is able to generate two different gate dielectrics with a single photolithographic step, the process requires direct contact between the first gate dielectric and the photoresist. Photoresist is known to be a significant source of contamination to gate dielectrics and, therefore, it is preferable to avoid direct contact between gate dielectrics and photoresist.

A fabrication technique that does not involve direct contact between gate dielectrics and photoresist is disclosed in U.S. Pat. No. 5,668,035, entitled "Method for Fabricating a Dual-Gate Dielectric Module for Memory with Embedded Logic Technology," issued to Fang et al. (hereinafter Fang). In accordance with the Fang fabrication technique, a first gate oxide (dielectric) layer is formed on two device areas of a substrate. A first polysilicon layer is deposited onto the first gate oxide layer that exists over the first and second device areas. The first polysilicon layer is then removed over the first device area utilizing a first photolithographic step. The first gate oxide layer is also removed over the first device area and a new, thinner, gate oxide layer is deposited over the first device area. A second polysilicon layer is deposited over both the first and second device areas. Portions of the second polysilicon layer are removed utilizing a second photolithographic step in order to even out the thicknesses of the first and second polysilicon layers that exist above the two gate oxide layers. Further known processing techniques are utilized to complete the desired devices. Although the Fang method avoids applying photoresist directly onto a gate oxide layer, the Fang method requires two photolithographic steps to create the dual gate dielectric layers. Photolithographic steps are a significant cost in the fabrication of semiconductor devices and, therefore, it is preferable to minimize the number of photolithographic steps that are required.

As a result of the stated shortcomings of the prior art techniques for fabricating dual gate dielectric layers, what is needed is a method for fabricating dual gate dielectric layers that avoids direct contact between gate oxide layers and photoresist, while minimizing the number of photolithographic processing steps that are required.

SUMMARY OF THE INVENTION

A method for fabricating dual gate dielectric layers on a semiconductor substrate involves utilizing a single photolithographic step to form layer stacks having two different gate dielectric layers and associated polysilicon layers, and then utilizing a physical planarization process to remove excess polysilicon and silicon oxide. The formation of the two gate dielectric layers includes associated polysilicon layers to ensure that the gate dielectric layers are never in direct contact with photoresist. Additionally, the method utilizes a physical planarization process to remove excess polysilicon and silicon oxide, where known prior art techniques utilize a second photolithographic step and chemical processing to remove excess polysilicon and silicon oxide. The physical planarization process is preferably a chemical mechanical polishing (CMP) process that removes excess polysilicon and silicon oxide from the layer stacks through abrasion.

A preferred method for fabricating dual gate dielectric layers is described for two gate dielectric layers that are formed over distinct first and second device areas of a silicon substrate. Initially, areas of field oxide are formed around the first and second device areas to electrically isolate the two device areas from each other. The field oxide areas are preferably grown using known oxidation techniques.

A first gate dielectric layer is then formed on the first and second device areas utilizing known thermal oxidation techniques. A first polysilicon layer is deposited onto the first gate dielectric layer and onto the areas of field oxide. The first polysilicon layer is preferably deposited utilizing low pressure chemical vapor deposition techniques.

After the first polysilicon layer is deposited, a photolithographic step is employed to form a pattern of photoresist on the first polysilicon layer. In the preferred method, photoresist covers the polysilicon layer over the first device area and peripheral areas, but not over the second device area.

The first polysilicon layer is then removed in areas where the first polysilicon layer is not protected by photoresist, thereby exposing the gate dielectric layer that is over the second device area. The first polysilicon layer is preferably removed utilizing a conventional etching process, such as an isotropic plasma etching.

The first gate dielectric layer over the second device area is then removed by means of a known etching technique, such as wet etching with a solution of hydrofluoric acid and deionized water. A second gate dielectric layer is formed on the exposed second device area and concurrently, a silicon oxide layer is formed on the first polysilicon layer that surrounds the second device area. In the preferred method, the second gate dielectric layer occupies a smaller surface area than the first gate dielectric layer.

A second polysilicon layer is blanket deposited onto the second gate dielectric layer and onto the silicon dioxide layer of the second device area. The second polysilicon layer is preferably deposited utilizing low pressure chemical vapor deposition techniques.

Portions of the second polysilicon layer are then removed utilizing a physical planarization technique. The preferred planarization technique is a chemical mechanical polishing technique that involves contacting the second polysilicon layer with rotating polishing elements and a liquid polishing agent. In one embodiment of the method, only the portion of the second polysilicon layer in the areas surrounding the second device is removed by chemical mechanical polishing. In a preferred embodiment of the method, portions of the dielectric layer in the areas surrounding the second device area are also removed in the chemical mechanical polishing process. In addition, it is preferred that portions of the first polysilicon layer are removed during chemical mechanical polishing in order to create a common plane between the first polysilicon layer and the second polysilicon layer. This improves the results of subsequent photolithographic steps.

In an enhancement to the preferred method, dummy polysilicon features are preserved over large areas of the field oxide in order to facilitate the planarization process. Because planarization is a physical process that involves abrasive contact between the layer stacks and polishing elements, uneven planarization, known as the "dishing effect," can occur when there are differences in layer stack height that span large distances. The dummy features of polysilicon provide support for the polishing element and enable even planarization.

DETAILED DESCRIPTION

Figure 1:
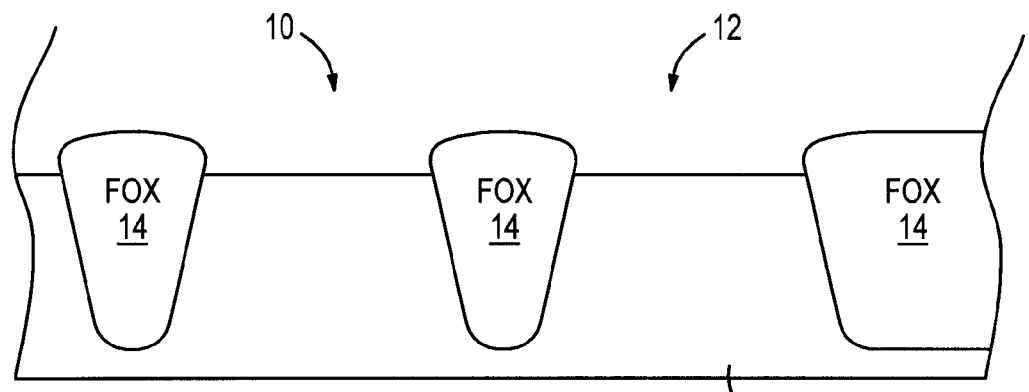
FIG. 1 is a depiction of two device areas separated by field oxide areas.

A preferred method for fabricating dual gate dielectric layers of different thicknesses is described with reference to FIGS. 1 through 9. The preferred method is described for two gate dielectric layers that are formed over two distinct device areas of a silicon substrate. Referring to FIG. 1, areas of field oxide 14 are formed in a silicon substrate 16 around first and second device areas 10 and 12 to electrically isolate the two device areas from each other. The field oxide areas are preferably grown utilizing known oxidation techniques. Although the two device areas 10 and 12 are shown as being directly adjacent to each other for description purposes, the device areas may be located further apart from each other on the same chip. It should be noted that a single chip will consist of multiple areas like the first device area and multiple areas like the second device area. In a preferred embodiment, the total area similar to the first device area is larger than the total area similar to the second device area, although it is not critical to the invention.

Figure 2:
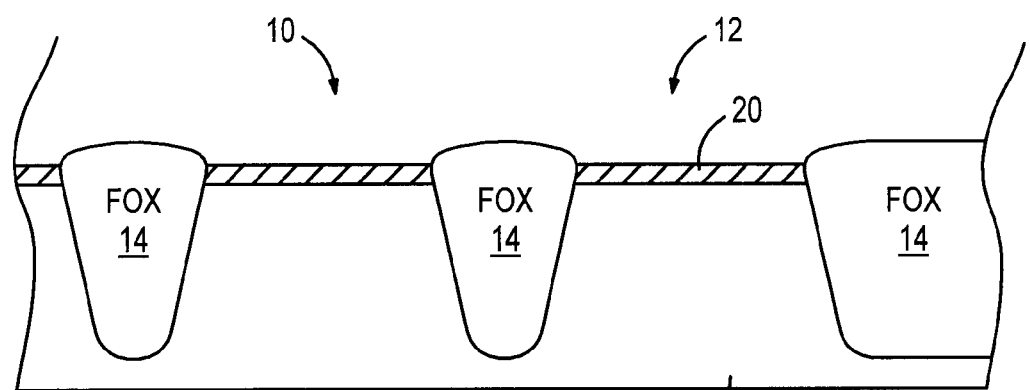
FIG. 2 is a depiction of the two device areas of FIG. 1 covered with a first gate oxide layer.

Referring to FIG. 2, a first gate dielectric layer 20 is formed on the silicon substrate over the first device area 10 and the second device area 12. The first gate dielectric layer is preferably silicon oxide that is formed, or "grown" on the surface of the silicon substrate 16 by means of conventional thermal oxidation techniques. In a preferred method, the first gate dielectric layer is formed in a thickness range of approximately 70 to 120 angstroms. Although a preferred dielectric layer thickness range is specified, other thicknesses of the first dielectric layer are possible.

Figure 3:
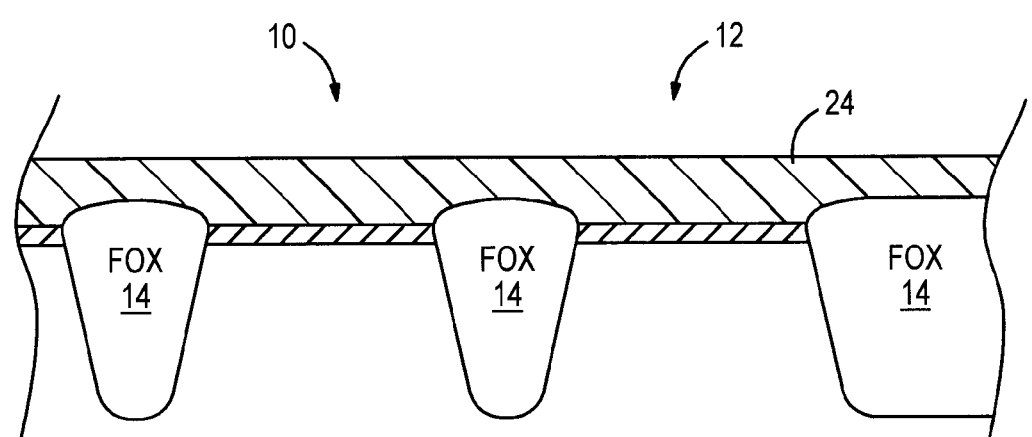
FIG. 3 is a depiction of the two device areas of FIG. 2 covered with a first polysilicon layer.

Referring to FIG. 3, a first polysilicon layer 24 is deposited onto the first gate dielectric layer 20 and onto the field oxide areas 14. The first polysilicon layer may be deposited using low pressure chemical vapor deposition (LPCVD) techniques, although other techniques are possible. Preferably, the first polysilicon layer is deposited at a thickness of approximately 1500 to 3000 angstroms, although other thickness ranges are possible. Depending on the desired electrical characteristic, the first polysilicon layer may be doped with either p-type or n-type dopants. Doping of the first polysilicon layer can occur at the time of deposition utilizing known in-situ doping techniques, or the first polysilicon layer can be doped in a subsequent step utilizing a technique such as ion implantation.

After the first polysilicon layer 24 is deposited onto the first gate dielectric layer 20, photolithographic techniques are utilized to define a pattern of photoresist (not shown) on the first polysilicon layer. The areas of polysilicon that are covered with photoresist are protected from subsequent etching steps. Although not shown, photoresist covers the polysilicon layer over the first device area 10 and not over the second device area 12.

Figure 4:
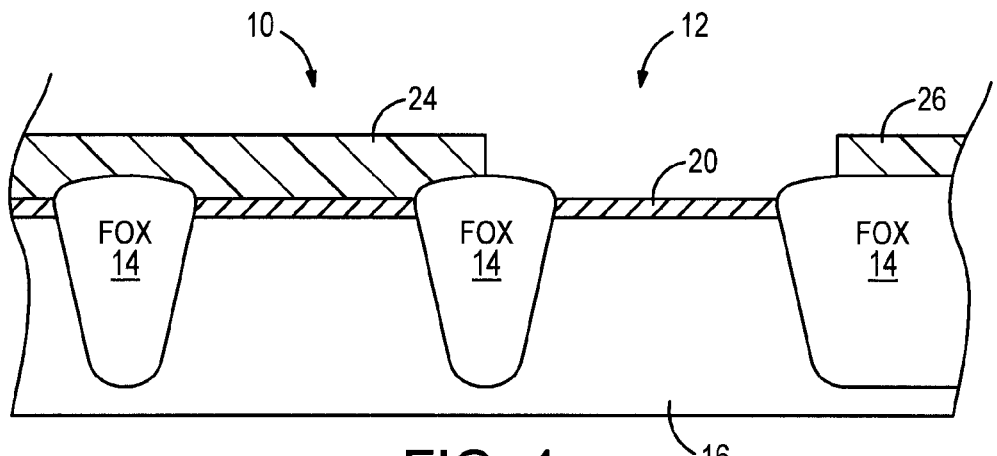
FIG. 4 is a depiction of the two device areas of FIG. 3 with a portion of the first polysilicon layer etched away over the second device area.

Referring to FIG. 4, the first polysilicon layer 24 is removed in areas where the polysilicon layer is not protected by photoresist, thereby exposing the first gate dielectric layer 20 that is over the second device area 12. The first polysilicon layer is preferably removed in a conventional etching process, such as anisotropic plasma etching. As shown in FIG. 4, in a preferred embodiment, the first polysilicon layer is not removed over areas 26 of large field oxide 14, even though the polysilicon layer serves no function in the operation of the device. These areas 26 of polysilicon, referred to as "dummy features," are preserved over selected portions of the field oxide to facilitate a later step of planarization that is described below. In one embodiment, the dummy features are formed in a tiled pattern.

Figure 5:
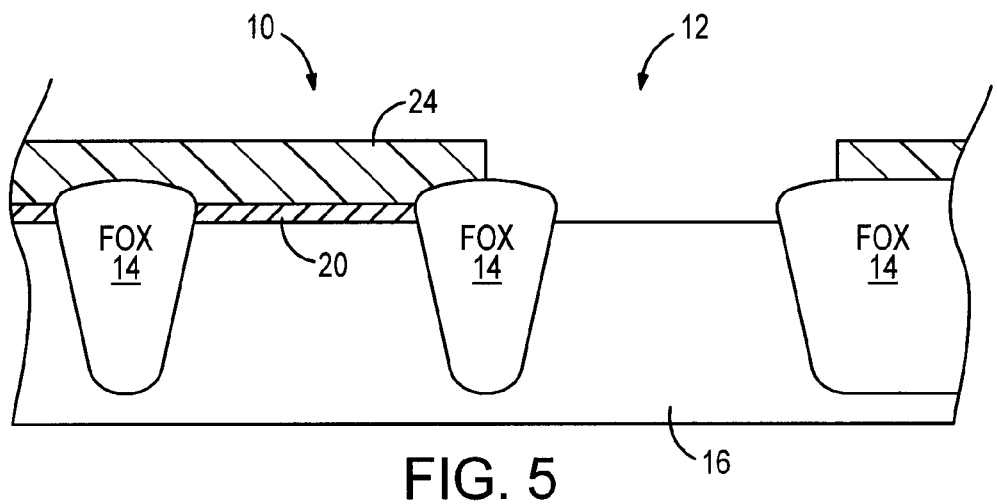
FIG. 5 is a depiction of the two device areas of FIG. 4 with the first gate dielectric layer removed above the second device area.

Referring to FIG. 5, the first gate dielectric layer 20 is removed over the second device area 12 utilizing a known etching technique, such as wet etching with a solution of hydrofluoric acid and deionized water. After the first gate dielectric layer is removed, the photoresist (not shown) protecting the remaining first polysilicon layer 24 is removed. The photoresist is preferably stripped using a liquid photoresist stripper, although other techniques of photoresist removal are possible. After the photoresist is removed, typically the layer stack is cleaned utilizing, for example, a wet chemical cleaning process.

Figure 6:
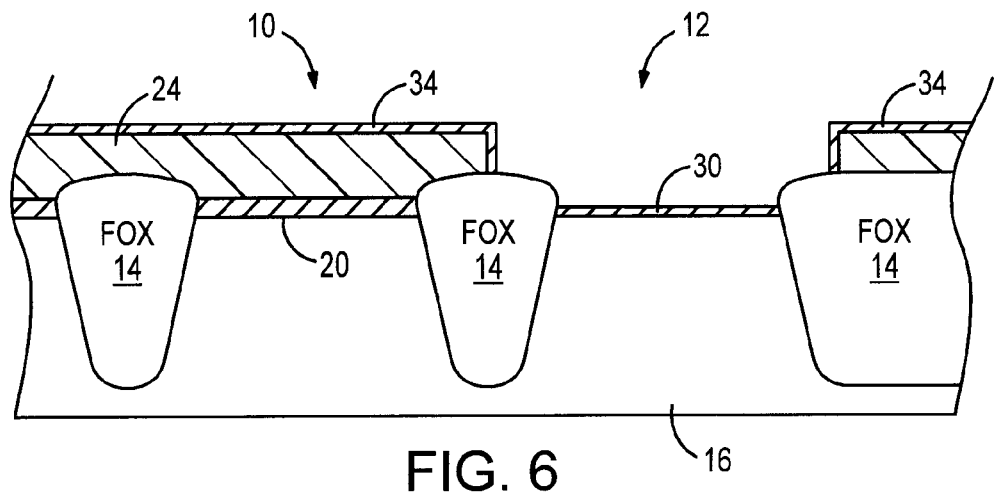
FIG. 6 is a depiction of the two device areas of FIG. 5 with a second gate dielectric layer formed over the first polysilicon layer and the second device area.

Referring to FIG. 6, a second gate dielectric layer 30 is formed on the exposed silicon substrate in the second device area 12. In addition to the second gate dielectric layer, a dielectric layer 34 is concurrently formed on the exposed surfaces of the first polysilicon layer 24 as a direct result of the same process. The second gate dielectric layer 30 and the dielectric layer 34 may be formed of silicon oxide using thermal oxidation techniques. In the preferred method, the second gate dielectric layer is thinner than the first gate dielectric layer 20 and ranges from approximately 70 to 90 angstroms. Although a dielectric thickness range is specified, other thicknesses of the second gate dielectric layer are possible.

Figure 7:
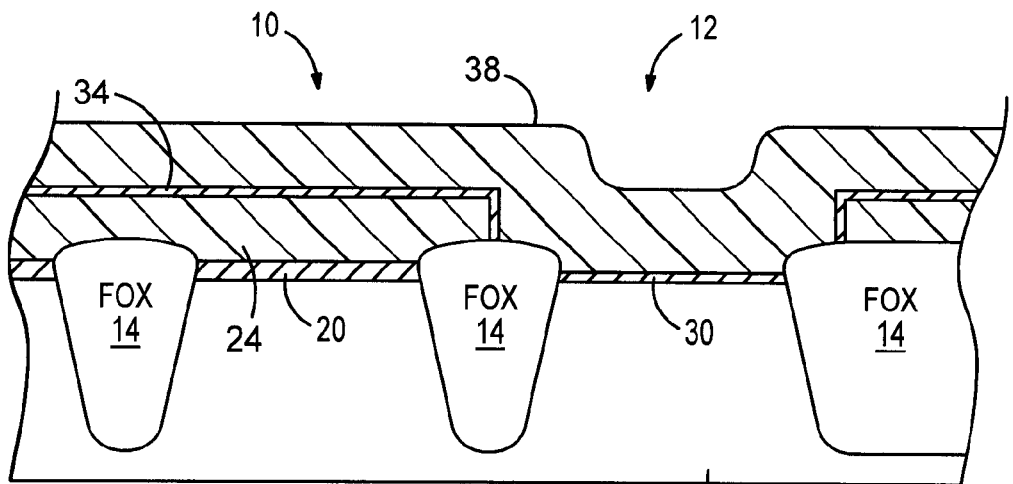
FIG. 7 is a depiction of the two device areas of FIG. 6 with a second polysilicon layer formed over the second gate dielectric layer.

Referring to FIG. 7, a second polysilicon layer 38 is deposited onto the second gate dielectric layer 30 and onto the dielectric layer 34 that is peripheral to the second gate dielectric layer. The second polysilicon layer is preferably deposited utilizing LPCVD techniques, although other techniques are possible. Preferably, the second polysilicon layer is deposited at a thickness of approximately 1500 to 3000 angstroms, although other ranges are possible. Depending on the desired characteristics, the second polysilicon layer may be doped with either p-type or n-type dopants. Doping can occur at the time of deposition using in-situ doping techniques, or the second polysilicon layer can be doped in a subsequent step utilizing a known technique such as ion implantation.

Figure 8:
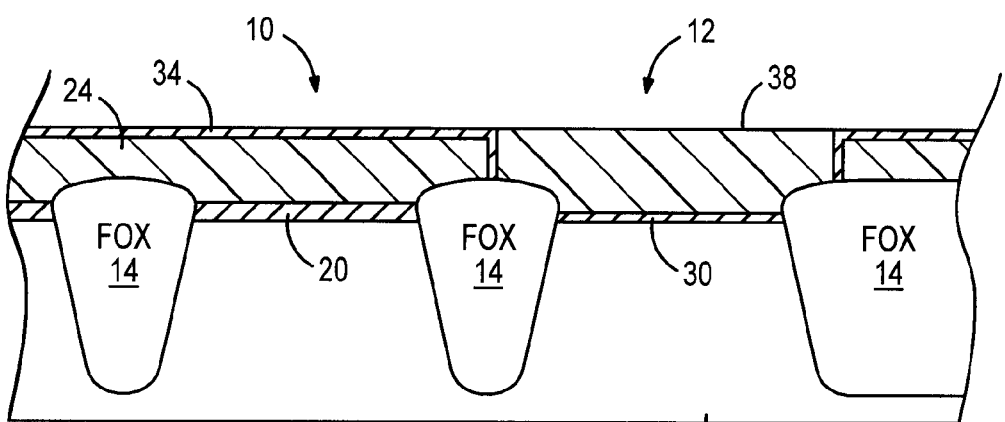
FIG. 8 is a depiction of the two device areas of FIG. 7 after excess polysilicon has been removed from the second polysilicon layer.

Referring to FIG. 8, the second polysilicon layer 38 deposited in the areas peripheral to the second device area 12 is removed to create a common top plane along the layers. In contrast to prior techniques which utilize a second photolithographic process to remove the desired portions of the second polysilicon layer, the selected portions of the second polysilicon layer are removed by means of a physical planarization technique. The planarization technique removes the second polysilicon layer by physical contact between planarization elements and the second polysilicon layer. The preferred planarization technique is chemical mechanical polishing (CMP). Chemical mechanical polishing involves contacting the second polysilicon layer with rotating polishing elements and a liquid polishing agent. Chemical mechanical polishing utilizes abrasion to effectively grind down the desired layer material. In one embodiment of the method, only the second polysilicon layer is removed in the areas that are peripheral to the second device area 12.

Figure 9:
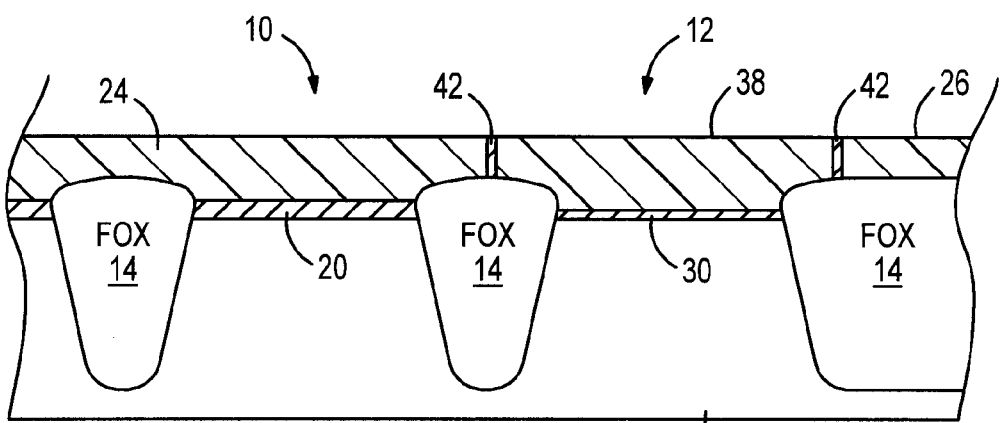
FIG. 9 is a depiction of the two device areas of FIG. 8 after an excess dielectric layer has been removed from the first polysilicon layer and the second polysilicon layer.

Referring to FIG. 9, in a preferred embodiment of the method, the horizontal portions of the dielectric layer 34 are removed from the areas that are peripheral to the second device area 12 in the same planarization (e.g., CMP) process. That is, portions of the second polysilicon layer and portions of the dielectric layer are removed in the same chemical mechanical polishing process to create a common plane along the first and second polysilicon layers. As shown in FIG. 9, small vertical portions of the dielectric layer 42 between the two polysilicon layers 24 and 38 are not removed by the planarization process. In addition to removing the second polysilicon layer 38 and the dielectric layer 34, portions of the first polysilicon layer may be removed in order to create a common top plane along the first and second polysilicon layers.

As briefly described above, the dummy polysilicon features 26, as shown in FIG. 9, are preserved over large field oxide areas in order to help during planarization. Because planarization is a physical process that involves abrasive contact between the layer stacks and polishing elements, uneven planarization can occur when there are differences in layer stack height that span large distances. The dummy features of polysilicon provide a continuous surface contact with the polishing element and enable even planarization. In the absence of the dummy features, the pressure required in chemical mechanical polishing can result in uneven planarization (e.g., dishing).

Figure 10:
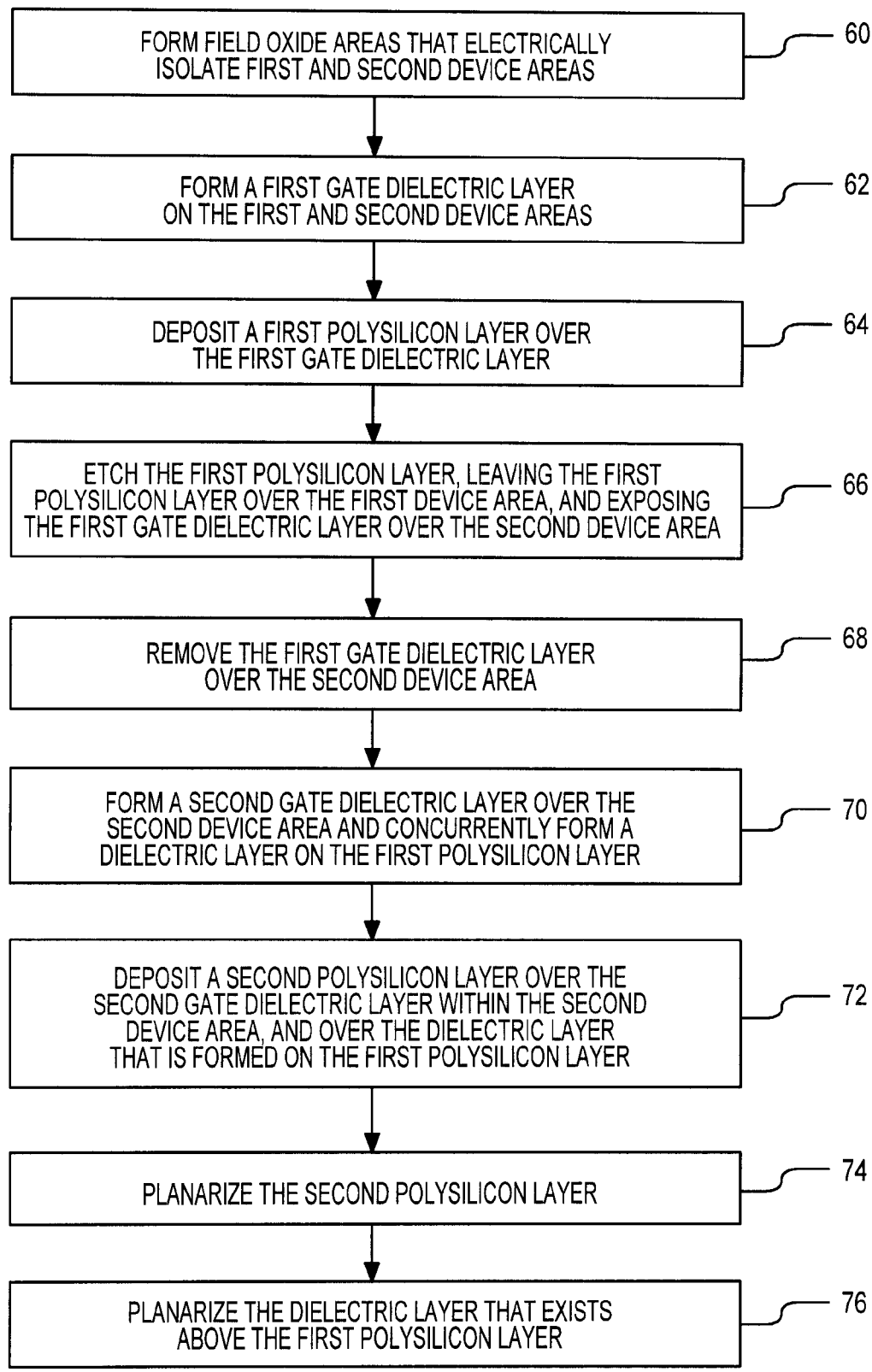
FIG. 10 is a preferred process flow diagram for a method for fabricating dual gate dielectric layers in accordance with the invention.

A process flow diagram for a preferred method for fabricating dual gate dielectric layers is shown in FIG. 10. In a step 60, field oxide areas are formed into a semiconductor substrate, electrically isolating a first device area from a second device area. In a step 62, a first gate dielectric layer is formed on the first and second device areas. In a step 64, a first polysilicon layer is deposited over the first gate dielectric layer. In a step 66, portions of the first polysilicon layer are etched away, leaving the first polysilicon layer over the first device area, and exposing the first gate dielectric layer over the second device area. In a step 68, the first gate dielectric layer is removed from the second device area. In a step 70, a second gate dielectric layer is formed over the second device area and concurrently a dielectric layer is formed on the first polysilicon layer. In a step 72, a second polysilicon layer is deposited over the second gate dielectric layer within the second device area, and over the dielectric layer that is formed on the first polysilicon layer. In a step 74, the second polysilicon layer is planarized, leaving portions of the second polysilicon layer over the second device area and removing the second polysilicon layer that exists over the first polysilicon layer. In an alternative step 76, the dielectric layer that exists above the first polysilicon layer is also planarized until the first polysilicon layer is exposed.

What is claimed is:

1. A method for fabricating dual gate dielectric layers on a semiconductor substrate comprising the steps of:
   defining electrically isolated device areas in said semiconductor substrate, said device areas including a first device area and a second device area;
   forming a first gate dielectric layer on said first and second device areas;
   depositing a first polysilicon layer over said first gate dielectric layer;
   etching said first polysilicon layer, leaving said first polysilicon layer over said first device area and exposing said first gate dielectric layer over said second device area;
   removing said first gate dielectric layer over said second device area;
   forming a second gate dielectric layer over said second device area and concurrently forming a dielectric layer on said first polysilicon layer;
   depositing a second polysilicon layer over said second gate dielectric layer within said second device area and over said dielectric layer that is formed on said first polysilicon layer; and
   planarizing said second polysilicon layer, leaving portions of said second polysilicon layer over said second device area and removing said second polysilicon layer that exists over said first polysilicon layer.

2. The method of claim 1 wherein said step of planarizing includes a step of chemical mechanical polishing said second polysilicon layer until said second polysilicon layer above said first polysilicon layer is removed.

3. The method of claim 1 further including a step of planarizing said dielectric layer that is formed on said first polysilicon layer until said first polysilicon layer is exposed.

4. The method of claim 3 further including a step of planarizing said first polysilicon layer and said second polysilicon layer into a common plane.

5. The method of claim 3 wherein said step of planarizing said dielectric layer includes a step of chemical mechanical polishing said dielectric layer until said first polysilicon layer is exposed.

6. The method of claim 1 wherein said step of etching said first polysilicon layer includes a step of leaving dummy polysilicon features over selected portions of field oxide areas that define said electrically isolated device areas, said dummy polysilicon features being formed from said first polysilicon layer.

7. The method of claim 6 further including a step leaving said dummy polysilicon features in a tiled pattern over said field oxide areas.

8. The method of claim 6 wherein said step of leaving dummy polysilicon features includes a step of leaving dummy polysilicon features having a thickness equal to said first polysilicon layer.

9. The method of claim 1 wherein said first gate dielectric and said second gate dielectric are formed having different thicknesses.

10. The method of claim 1 wherein said first gate dielectric is formed thicker than said second gate dielectric.

11. The method of claim 1 wherein said step of defining said electrically isolated device areas includes forming field oxide areas such that said first device area is larger than said second device area.

12. A method for fabricating dual gate oxide layers on the same semiconductor substrate comprising steps of:
   defining a first device area and a second device area in said substrate;
   forming a first gate oxide on said first device area and said second device area;
   depositing a first polysilicon layer on said first gate oxide;
   creating a pattern of photoresist on said first polysilicon layer, said pattern including an absence of photoresist over said second device area;
   etching away said first polysilicon layer that is over said second device area and exposing a portion of said first gate oxide;
   removing said exposed portion of said first gate oxide that is over said second device area;
   removing said pattern of photoresist on said first polysilicon layer;
   forming a second gate oxide on said second device area, and simultaneously forming a silicon oxide layer on said first polysilicon layer;
   depositing a second polysilicon layer on said second gate oxide and on said silicon oxide layer; and
   polishing said second polysilicon layer, said silicon oxide layer, and said first polysilicon layer such that exposed surfaces of said first and second polysilicon layers form a common plane.

13. The method of claim 12 wherein said steps of creating a pattern and etching away said first polysilicon layer include a step of forming dummy features over selected portions of field oxide areas formed in said defining step, said dummy features being formed from said first polysilicon layer.

14. The method of claim 13 wherein said step of polishing includes a step of supporting a polishing element at least partially by means of contact with said dummy features.

15. The method of claim 14 wherein said step of polishing is a step of chemical mechanical polishing (CMP) that includes contacting said first polysilicon layer, said second polysilicon layer, and said dummy features with rotating polishing elements and a polishing fluid.

16. The method of claim 12 wherein said first gate oxide is formed having a first thickness, and said second gate oxide is formed having a second thickness which is thinner than said first thickness.

17. A method for fabricating dual gate oxide layers on a semiconductor substrate comprising the steps of:
   forming field oxide areas onto said semiconductor substrate that electrically isolate a first device area and a second device area;
   forming a first gate oxide on said first and second device areas;
   depositing a first polysilicon layer on said first gate oxide and over said field oxide areas;
   creating a pattern of photoresist that covers said first polysilicon layer over said first device areas and that covers dummy features of said first polysilicon layer that are located over selected portions of said field oxide areas;
   removing areas of said first polysilicon layer that are not covered by said pattern of photoresist;
   removing areas of said first gate oxide that are not covered by said pattern of photoresist, thereby exposing said second device area;
   forming a second gate oxide on said second device area and simultaneously forming a silicon oxide layer on said first polysilicon layer;
   forming a second polysilicon layer on said second gate oxide and on said silicon oxide layer; and
   planarizing said first polysilicon layer, said second polysilicon layer, and said silicon oxide layer utilizing chemical mechanical polishing (CMP).

18. The method of claim 17 wherein said step of planarizing includes a step of supporting at least part of a CMP polishing element with said dummy features of said first polysilicon layer.

* * * * *